United States Patent
Miller (10) Patent No.: US 10,840,012 B2
(45) Date of Patent: Nov. 17, 2020

(54) SINGLE INPUT CIRCUIT FOR RECEIVING OUTPUT FROM A DI/DT SENSOR OR CURRENT TRANSFORMER AND CIRCUIT BREAKER INCLUDING SAME

(71) Applicant: EATON INTELLIGENT POWER LIMITED, Dublin (IE)

(72) Inventor: Theodore J. Miller, Oakdale, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/197,504

(22) Filed: Nov. 21, 2018

(65) Prior Publication Data
US 2020/0161045 A1    May 21, 2020

(51) Int. Cl.
H01F 27/42      (2006.01)
G01R 19/00     (2006.01)

(52) U.S. Cl.
CPC ....... H01F 27/427 (2013.01); G01R 19/0023 (2013.01); G01R 19/0092 (2013.01)

(58) Field of Classification Search
CPC ....... H01F 27/427; G01R 15/186; G05F 1/32; G05F 1/13; H02M 2001/0009; H02H 1/046; H02H 3/08; H02H 9/02
See application file for complete search history.

(56) References Cited

U.S. PATENT DOCUMENTS 3,815,011 A  *  6/1974  Milkovic ............... G01R 15/18
                                                          323/357
4,713,598 A  * 12/1987  Smith .................. H01H 47/007
                                                          323/245
6,346,805 B1     2/2002  Ermisch et al.
(Continued)

FOREIGN PATENT DOCUMENTS

DE        296 22 948 U1      9/1997
DE    10 2018 201310 A1     10/2018
KR         101 013 064 B1     2/2011

OTHER PUBLICATIONS

Nikko Phongchit "Placing Multiple Current Transformers in a Single Channel", XP055689630, Retrieved from the Internet: URL:https://www.setra.com/blog/benefit-of-multiple-current-transformers [retrieved on Apr. 28, 2020], Mar. 3, 2016, 20 pp.
(Continued)

*Primary Examiner* — Gary L Laxton
(74) *Attorney, Agent, or Firm* — Eckert Seamans Cherin & Mellott, LLC (57) ABSTRACT

A circuit for receiving the output from one of either a current transformer or a di/dt sensor includes: an input pair having a first input and a second input; a first output; a second output; a current transformer input circuit connected between the first input and the second input; and a di/dt sensor input circuit connected between the first input and the second input. The current transformer input circuit is configured to receive output from a current transformer connected to the input pair and to output a signal representative of the current sensed thereby via the first output. The di/dt sensor input circuit is configured to receive output from a di/dt sensor connected to the input pair and to output a signal representative of the current or time rate of change of the current sensed thereby via the second output.

18 Claims, 3 Drawing Sheets

(56) References Cited

U.S. PATENT DOCUMENTS

| | | | | |
|---|---|---|---|---|
| 6,577,484 B1* | 6/2003 | Macbeth | ............ | H02H 1/0015 |
| | | | | 361/92 |
| 6,678,136 B2* | 1/2004 | Maeda | ................. | H02H 3/006 |
| | | | | 361/78 |
| 6,987,389 B1* | 1/2006 | Macbeth | ............ | H02H 1/0015 |
| | | | | 324/536 |
| 8,160,829 B2* | 4/2012 | Kalenine | ............... | G01R 15/09 |
| | | | | 307/35 |
| 9,689,900 B1* | 6/2017 | Chikamatsu | ........ | G01R 15/146 |
| 2011/0279942 A1* | 11/2011 | Bishop | ............... | G01R 15/183 |
| | | | | 361/93.6 |
| 2014/0092503 A1* | 4/2014 | Ostrovsky | ........... | H02H 1/0015 |
| | | | | 361/45 |

OTHER PUBLICATIONS

European Patent Office "extended European search report", from corresponding EP Patent Application No. 19209007.4, dated May 11, 2020, 11 pp.

* cited by examiner

SINGLE INPUT CIRCUIT FOR RECEIVING OUTPUT FROM A DI/DT SENSOR OR CURRENT TRANSFORMER AND CIRCUIT BREAKER INCLUDING SAME

BACKGROUND

Field

The disclosed concept relates generally to arrangements for sensing current, and, more particularly, to arrangements for sensing current used in conjunction with circuit breakers. The disclosed concept also relates to circuit breakers including such arrangements.

Background Information

In circuit breakers and other applications, it is often desirable or necessary to connect a current sensor mounted external the breaker. Such a sensor may be used to sense an external neutral current, a ground current, or wrapped around multiple conductors to sense a current imbalance. Traditionally, the application was filled by current transformers. However, recently Rogowski coils have become more popular for several reasons: they can be made smaller and lighter than current transformers; they can be more easily made in split core configurations providing for a simpler installation; and they do not suffer from the effects of saturation.

The outputs of current transformers and Rogowski coils are quite different. Current transformers produce output currents proportional to their primary currents. The proportionality of this current is generally quite constant even when burdened by higher impedance, nonlinear loads.

On the other hand, di/dt sensors, e.g., without limitation, Rogowski coils, produce voltages proportional to sensed di/dt. The voltages are typically small, around 100 µV/A, with their function being maintained only for relatively high impedance loads.

For ease of use by an end user, it would be preferable to handle these two different types of sensors outputs with a single input so as to eliminate the need to provide multiple input pairs for such sensors on circuit breakers and therewith also reduce/eliminate any potential errors in connecting of either of such sensors by an end user to a circuit breaker.

SUMMARY

These needs and others are met by embodiments of the disclosed concept, in which a circuit is adapted to receive input from either a current transformer or a di/dt sensor and to output a signal corresponding to the input.

In accordance with one aspect of the disclosed concept, a circuit comprises: an input pair having a first input and a second input; a first output; a second output; a current transformer input circuit connected between the first input and the second input; and a di/dt sensor input circuit connected between the first input and the second input, wherein the current transformer input circuit is configured to receive output from a current transformer connected to the input pair and to output a signal representative of the current sensed thereby via the first output, and wherein the di/dt sensor input circuit is configured to receive output from a di/dt sensor connected to the input pair and to output a signal representative of the current or time rate of change of the current sensed thereby via the second output.

The current transformer input circuit and the di/dt sensor input circuit may be connected in a parallel arrangement.

The circuit may further comprise: a third circuit connected between the first input and the second input, the third circuit comprising: a ground connected between the first input and the second input, a fifth resistor connected in parallel with a second capacitor connected between the first input and the ground, and a sixth resistor connected in parallel with a third capacitor connected between the ground and the second input.

The current transformer input circuit, the di/dt sensor input circuit, and the third circuit may be connected in a parallel arrangement between the first input and the second input.

The circuit may further comprise: a third circuit connected between the first input and the second input, the third circuit comprising: a first arrangement comprising: a ground connected between the first input and the second input; a fifth resistor connected between the first input and the ground; and a sixth resistor connected between the ground and the second input; and a second arrangement comprising a third zener diode and a fourth zener diode connected opposing in series between the first input and the second input.

The current transformer input circuit may comprise: a sense resistor connected between the first input and the second input; a first resistor connected in parallel with one of either a first transient voltage suppression diode or a first Zener diode connected between the first input and the sense resistor; a second resistor connected in parallel with another one of a second transient voltage suppression diode or a second Zener diode connected between the sense resistor and the second input; and a first amplifier having a first input connected on a first side of the sense resistor, a second input connected on an opposite second side of the sense resistor, and an output connected to the first output.

The current transformer input circuit may comprise: a sense resistor connected between the first input and the second input; a first field effect transistor connected between the first input and the sense resistor; a second field effect transistor connected between the sense resistor and the second input; and a first amplifier having a first input connected on a first side of the sense resistor, a second input connected on an opposite second side of the sense resistor, and an output connected to the first output.

The di/dt sensor input circuit may comprise: a first capacitor connected between the first input and the second input; a third resistor connected between the first input and the first capacitor; a fourth resistor connected between the first capacitor and the second input; and a second amplifier having a first input connected on a first side of the first capacitor and a second input connected on an opposite second side of the first capacitor, and an output connected to the second output.

The di/dt sensor input circuit may comprise: a first capacitor connected between the first input and the second input; a third resistor connected between the first input and the first capacitor; a fourth resistor connected between the first capacitor and the second input; and a second amplifier having a first input connected on a first side of the first capacitor and a second input connected on an opposite second side of the first capacitor, and an output connected to the second output.

The di/dt sensor input circuit may comprise: a second amplifier having a first input, a second input, and an output connected to the second output; a third resistor connected between the first input of the circuit and the first input of the second amplifier; and a fourth resistor connected between the second input of the circuit and the second input of the second amplifier.

The di/dt sensor input circuit may comprise: a second amplifier having a first input, a second input, and an output connected to the second output; a third resistor connected between the first input of the circuit and the first input of the second amplifier; and a fourth resistor connected between the second input of the circuit and the second input of the second amplifier.

The di/dt sensor input circuit may comprise: a second amplifier having a first input, a second input, and an output connected to the second output; a third resistor connected between the first input of the circuit and the first input of the second amplifier; and a fourth resistor connected between the second input of the circuit and the second input of the second amplifier.

In accordance with another aspect of the disclosed concept, a circuit comprises: an input pair having a first input and a second input; an output; a first sensor input circuit connected between the first input and the second input, the first sensor input circuit comprising: a sense resistor connected between the first input and the second input; a first field effect transistor connected between the first input and the sense resistor; and a second field effect transistor connected between the sense resistor and the second input; and a second sensor input circuit connected between the first input and the second input, the second sensor input circuit comprising: an amplifier having a first input, a second input, and an output connected to the output of the circuit; a third resistor connected between the first input of the circuit and the first input of the amplifier; and a fourth resistor connected between the second input of the circuit and the second input of the amplifier, wherein the circuit is configured to receive output from one of either a current transformer or a di/dt sensor and output a signal representative of a current sensed by the one of either the current transformer or the di/dt sensor via the output.

The circuit may further comprise: a third circuit connected between the first input and the second input, the third circuit comprising: a first arrangement comprising: a ground connected between the first input and the second input; a fifth resistor connected between the first input and the ground; and a sixth resistor connected between the ground and the second input; and a second arrangement comprising a third zener diode and a fourth zener diode connected opposing in series between the first input and the second input.

In accordance with yet another aspect of the disclosed concept, a circuit breaker comprises: a circuit as previously recited; and a microcontroller connected to the first output and the second output of the circuit.

The microcontroller may be adapted to automatically sense which output from the first output or the second output corresponds to a current sensed by a current sensor connected to the input pair.

In accordance with a further aspect of the disclosed concept, a current sensing arrangement comprises: a circuit as previously recited; a current sensor structured to provide an output dependent on a sensed current, the current sensor connected to the input pair of the circuit; and a microcontroller connected to the first output and the second output of the circuit, wherein the current sensor is one of either a di/dt sensor or a current transformer; and wherein the circuit is configured to receive the output of the one of either the di/dt sensor or the current transformer which is connected to the input pair and provide an output signal which corresponds to the one of either the di/dt sensor or the current transformer via either the first output or the second output, dependent on which one of the di/dt sensor or the current transformer is connected to the input pair.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, clockwise, counterclockwise and derivatives thereof, relate to the orientation of the elements shown in the drawings and are not limiting upon the claims unless expressly recited therein.

As employed herein, the term "di/dt sensor" shall be used to refer to any device for sensing current which produces an output voltage which is proportional to the time rate of change of the current sensed by such device. For example, without limitation, a Rogowski coil is an example of a suitable di/dt sensor which may be employed in embodiments of the disclosed concept.

As employed herein, the statement that two or more parts are "coupled" together shall mean that the parts are joined together either directly or joined through one or more intermediate parts.

As employed herein, the statement that two or more parts are "connected" shall mean that the parts are joined either directly or through one or more intermediate parts in a manner such that an electrical pathway is formed through such parts.

As employed herein, the term "number" shall mean one or an integer greater than one (i.e., a plurality).

Figure 1:
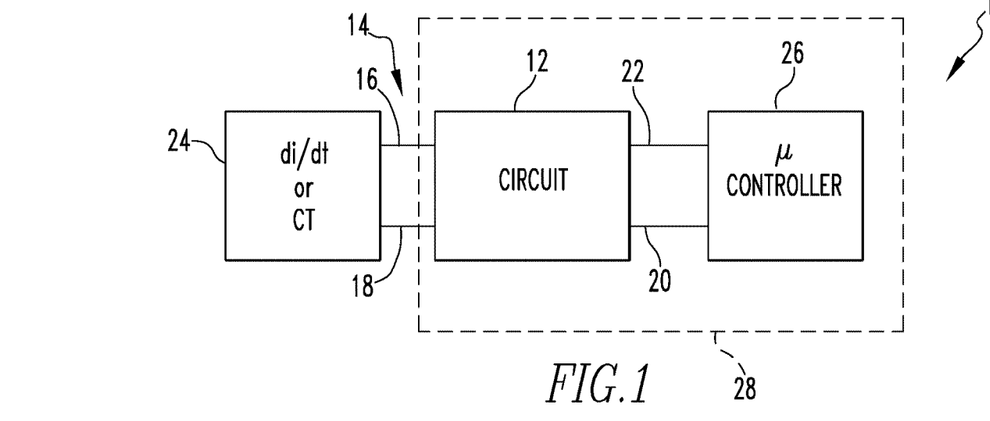
FIG. 1 is a block diagram of a current sensing arrangement in accordance with an example embodiment of the disclosed concept.

Referring to FIG. 1, a block diagram of a current sensing arrangement 10 in accordance with an example embodiment of the disclosed concept is shown. Arrangement 10 includes a circuit 12 having an input pair 14 consisting of a first input 16 and a second input 18. Circuit 12 further includes a first output 20 and a second output 22. Current sensing arrangement 10 further includes a current sensor 24 connected to input pair 14 which is structured to provide an output dependent on a current sensed by current sensor 24. In example embodiments of the disclosed concept, current sensor 24 is one of either a di/dt sensor (di/dt) or a current transformer (CT). Circuit 12 is configured to receive the output from the one of the di/dt sensor or the current transformer which is connected to input pair 14 and to provide an output signal which corresponds to the input received from the di/dt sensor or the current transformer which is connected to input pair 14. The output signal is provided via either first output 20 or second output 22, depending on which of the di/dt sensor or the current transformer is connected to input pair 14. It is to be appreciated that a given current sensing arrangement 10 in accordance with the disclosed concept may include either of a di/dt sensor or a current transformer connected to input pair 14 at a given time, but not both of a di/dt sensor and current transformer connected simultaneously.

Continuing to refer to FIG. 1, current sensing arrangement 10 further includes a microcontroller 26 which is connected to first output 20 and second output 22 of circuit 12. Microcontroller 26 may be any suitable processing device and is adapted and programmed to determine which of the first output 20 and second output 22 from circuit 12 corresponds to either of the di/dt sensor or current transformer connected to input pair 14, as will be discussed below.

It is to be appreciated that circuit 12 may be a standalone unit which may be connected to a suitable microcontroller 26 and which may have current sensor 24 coupled thereto. Alternatively, circuit 12 and microcontroller 26 may be included as part of a circuit breaker 28, such as schematically shown partially in FIG. 1 in dashed line. In such arrangement, current sensor 24 may be readily connected to input pair 14 which may be provided generally on a housing (not numbered) of circuit breaker 28.

Figure 2:
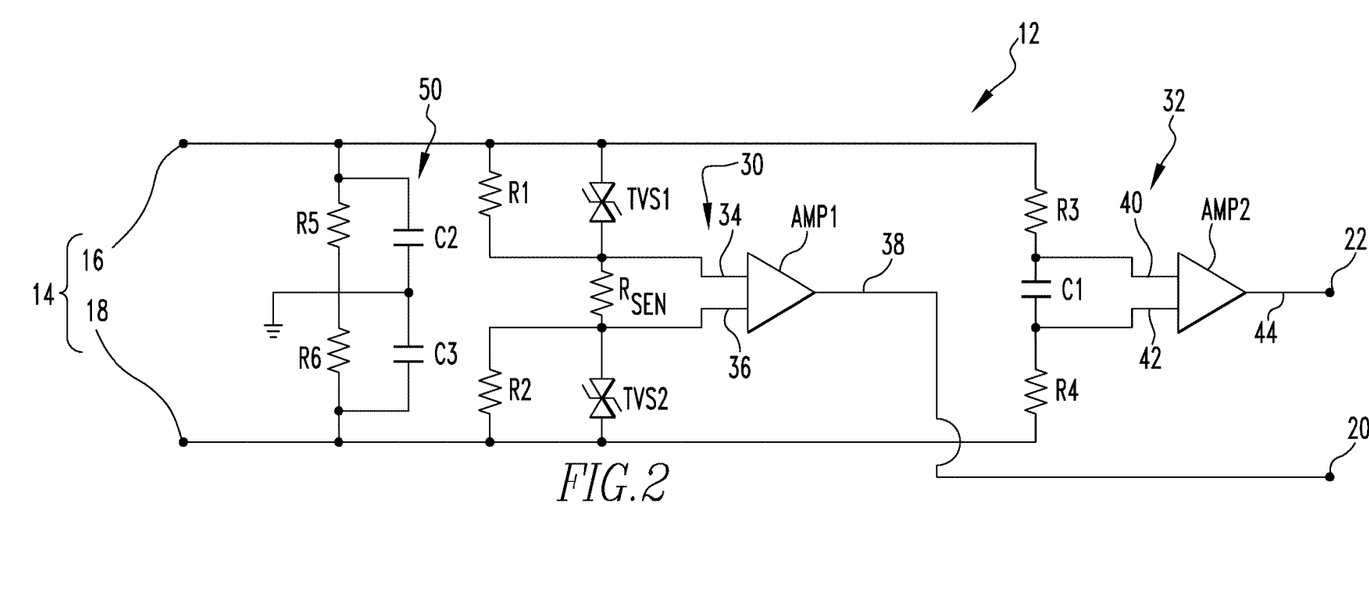
FIG. 2 is a circuit diagram of an example circuit in accordance with an example embodiment of the disclosed concept which may be employed in the current sensing arrangement of FIG. 1.

Referring now to FIG. 2, a circuit diagram of an example circuit 12 in accordance with an example embodiment of the disclosed concept which may be employed in the current sensing arrangement 10 of FIG. 1 is shown. As previously discussed in conjunction with FIG. 1, circuit 12 includes an input pair 14 having a first input 16 and a second input 18, as well as a first output 20 and a second output 22. Circuit 12 further includes a current transformer input circuit, shown generally at 30, connected between first input 16 and second input 18, as well as a di/dt sensor input circuit, shown generally at 32, which likewise is connected between first input 16 and second input 18 in a parallel arrangement with current transformer input circuit 30.

Current transformer input circuit 30 is configured to receive output from a current transformer employed as current sensor 24 connected to input pair 14 and to output a signal representative of the current sensed thereby via first output 20 for use by a further electrical component, e.g., without limitation, microcontroller 26. Current transformer input circuit 30 includes: a sense resistor Rsen connected between first input 16 and second input 18; a first resistor R1 connected in parallel with a first transient voltage suppression diode TVS1 connected between first input 16 and sense resistor Rsen; and a second resistor R2 connected in parallel with a second transient voltage suppression diode TVS2 connected between sense resistor Rsen and second input 18. Alternatively, a first and a second Zener diode could be used in place of first and second transient voltage suppression diodes TVS1 and TVS2. Current transformer input circuit 30 further includes a first differential amplifier AMP1 having a first input 34 connected on a first side of sense resistor Rsen and a second input 36 connected on an opposite second side of sense resistor Rsen so as to measure the voltage across sense resistor Rsen. An output 38 from first differential amplifier AMP1 is connected to first output 20 of circuit 12.

The example current transformer input circuit 30 shown in FIG. 2 is a balanced configuration that takes advantage of the fact that current transformers will provide primary proportional current to higher voltage, non-linear loads. Transient voltage suppression diodes TVS1 and TVS2 (or the alternative zener diodes discussed above), have little effect on the secondary current from a current transformer connected to input pair 14. If the burden on the current transformer created by the transient voltage suppression diodes or the zener diodes is too great, it is possible to add a switch (FET) to insert the burden resistors directly across the current transformer. An example of such alternate arrangement is discussed further below in conjunction with FIG. 4. In this case, output from a di/dt sensor utilized as current sensor 24 should be kept well below one diode drop (or below PS voltage if an analog switch is used).

Continuing to refer to FIG. 2, di/dt sensor input circuit 32 is configured to receive the output from a di/dt sensor employed as current sensor 24 connected to input pair 14 and to output a signal representative of the current sensed thereby via second output 22 for use by a further electrical component, e.g., without limitation, microcontroller 26. The di/dt sensor input circuit 32 includes: a first capacitor C1 connected between first input 16 and second input 18 of input pair 14, a third resistor R3 connected between first input 16 and first capacitor C1, and a fourth resistor R4 connected between first capacitor C1 and second input 18. The di/dt sensor input circuit 32 further includes a second differential amplifier AMP2 having a first input 40 connected on a first side of first capacitor C1 and a second input 42 connected on an opposite second side of first capacitor C1 so as to measure the voltage across first capacitor C1. An output 44 from the second differential amplifier AMP2 is connected to second output 22 of circuit 12.

Similar to current transformer input circuit 30, di/dt sensor input circuit 32 is a balanced configuration. As previously mentioned, output voltages from a di/dt sensor are generally less than what can be produced by a current transformer for equivalent primary currents. Normal operating currents through a di/dt sensor will not produce a voltage anywhere near large enough to cause current to flow in the transient voltage suppression diodes TVS1 and TVS2 or current transformer input circuit 30. Accordingly, transient voltage suppression diodes TVS1 and TVS2 therefore appear as a high impedance to a di/dt sensor connected to input pair 14 and thus have no impact on output from the di/dt sensor. Meanwhile, the arrangement of third and fourth resistors R3 and R4 and first capacitor C1 form a passive integration circuit that functions independent of the state of the power supplies for second differential amplifier AMP2 (as well as microcontroller 26). This configuration has some advantages in circuit breaker applications although other interfaces without passive integration are possible.

Continuing to refer to FIG. 2, circuit 10 further includes a third circuit, generally shown at 50, which is connected between first input 16 and second input 18 in a parallel arrangement with current transformer input circuit 30 and di/dt sensor input circuit 32. Third circuit 50 includes a ground connected between first input 16 and second input 18; a fifth resistor R5 connected in parallel with a second capacitor C2 connected between first input 16 and the ground; and a sixth resistor R6 connected in parallel with a third capacitor C3 connected between the ground and second input 18. In operation, third circuit 50 serves as a path to ground for input current to amplifiers AMP1 and AMP2 while second and third capacitors C2 and C3 serve to roll off high-frequency noise.

In one example embodiment of the concept illustrated in FIG. 2, first and second resistors R1 and R2 having a resistance of 100 kΩ; a sense resistor Rsen having a resistance of 1Ω, and transient voltage suppression diodes TVS1 and TVS2 of 5.1 v were employed in current transformer input circuit 30. In the same example embodiment, third and fourth resistors R3 and R4 having a resistance of 200 kΩ along with a 0.1 µF first capacitor C1 were employed in di/dt sensor input circuit 32. Also in the same example embodiment, fifth and sixth resistors R5 and R6 having a resistance in the range of 10 kΩ-100 kΩ were employed along with second and third capacitors C3 and C4 in the range of 100 pF-1000 pF in third circuit 50. It is to be appreciated that such example values are provided for exemplary purposes only and that other values may be employed without varying from the scope of the disclosed concept.

Table 1 below summarizes the outputs 20, 22 that can be expected from circuits 30 and 32. Automatic sensing can be considered in a microcontroller, such as microcontroller 26, that looks for saturated outputs on second output 22 from di/dt sensor input circuit 32 paired with small, 'reasonable' levels on first output 20 from current transformer input circuit 30. Such a situation describes a current transformer utilized as current sensor 24 connected to input pair 14 of circuit 12. Conversely, if the output from second output 22 from di/dt sensor input circuit 32 is 'reasonable' and the output from first output 20 from current transformer input circuit 20 is at or near zero, then a di/dt sensor is being utilized as current sensor 24 connected to input pair 14 of circuit 12. As used herein, the term 'reasonable' would is used to indicate an rms value in the normal range of operation.

TABLE 1

Comparison of current sensor input to, and outputs from example circuit

| Sensing device employed as current sensor 24 | First output 20 | Second output 22 |
| --- | --- | --- |
| Current Transformer | Saturated | α sensed current |
| di/dt sensor | α sensed current | ≈0 |

For the design shown in FIG. 2 with the particular values described above, the connection of a current transformer to input pair 14 will result in saturation of output 44 of second amplifier AMP2 for very small primary currents. This is because current will flow through the diodes TVS1 and TVS2 resulting in what would appear to be very large di/dt sensor signals. Meanwhile, output 38 from first amplifier AMP1 would appear normal. The connection of a di/dt sensor to input pair 14 would result in normal appearing signals from second amplifier AMP2 and a nearly zero signal from first amplifier AMP1. The difficult case is when a di/dt sensor is connected and a large fault occurs, rms signal levels from the first and second amplifiers AMP1 and AMP2 could duplicate those seen for smaller currents when a current transformer is connected to input pair 14. When looked at in conjunction with the phase currents, proper selection can be made. Additionally a sample by sample comparison can be done. With a di/dt sensor connected to input pair 14, even at the highest fault currents, a substantial portion of the half cycle on first amplifier AMP1 will be zero.

It is to be appreciated that the circuit 10 is self-protecting in that it will not allow large voltages to be generated across a connected current transformer no matter the configuration—in fact hardware configuration is not altered for different types of coil. One must watch that the current transformers employed are not significantly impacted by the zener burden put on them by the transient voltage suppression diodes TVS1 and TVS2. The design allows for a fair amount of flexibility in the choice of the transient voltage suppression diodes TVS1 and TVS2 utilized. Such values must only be large enough to assure that they do not 'turn on' under normal di/dt sensor operation as such occurrence would lead to current reading errors.

Current transformers utilized must be capable of driving the voltages of the transient voltage suppression diodes TVS1 and TVS2 selected. In the example embodiment utilizing components with the values provided above, such voltage is 2×5.1V+2×Vf+(voltage across the sense resistor). This will be on the order of 12V. In this case 'driving the voltages' means that the current transformer should be able to provide rms current to within approximately 5% of the desired value of Iprimary/N. In other words the core of the current transformer should not saturate when burdened by this voltage.

To lower the burden on the current transformer, the voltage of the transient voltage suppression diodes TVS1 and TVS2 may be lowered to the point where the voltages created by the di/dt sensor at maximum current are lower than the total voltage of the transient voltage suppression diodes TVS1 and TVS2. Meeting this criteria assures that transient voltage suppression diodes TVS1 and TVS2 always appear as a high impedance to the di/dt sensor. For a typical di/dt sensor with a sensitivity of around 300 µV/A. The 12V string described above would be suitable for peak currents below 40 kA or 28 kA rms. The use case for these sensors is normally for ground or zero sequence sensing, which is often limited to 1200 A rms max. So the selected transient voltage suppression diodes TVS1 and TVS2 are quite conservative. If 1200 A rms is used as the max, then the transient voltage suppression diodes TVS1 and TVS2 could be replaced by simple silicon diodes. It is to be appreciated that whatever diodes are selected they must be able to handle the maximum fault currents expected for the particular application. Depending on the current transformer this could reach many amps for a half cycle.

The example amplifiers AMP1 and AMP2 have differential inputs. This keeps the two lines from the coil balanced. It is possible to create a circuit with similar performance without balanced inputs. However the voltage across the current transformer must be symmetric. That means that the positive voltage across the current transformer must be equal the negative voltage across the current transformer. Failure to do so will result in the current transformer drifting toward saturation and poor performance. The selected amplifiers AMP1 and AMP2 above require that the common mode voltage be kept within the power supply range of the amp. Other amplifier selections do not have this requirement.

Figure 3:
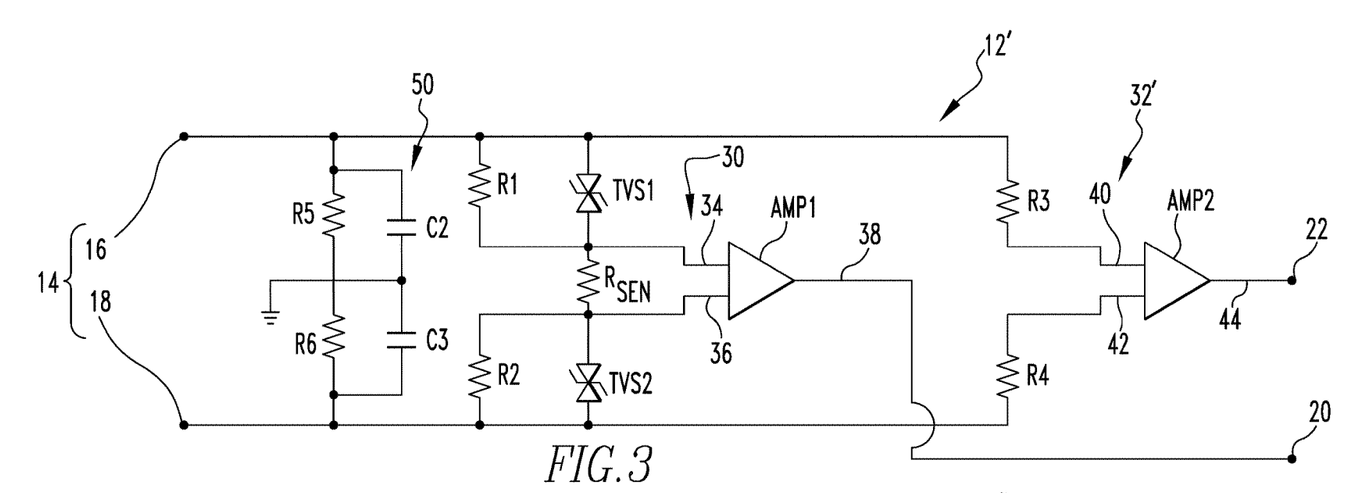
FIG. 3 is a circuit diagram of an example circuit in accordance with an example embodiment of the disclosed concept which may be employed in the current sensing arrangement of FIG. 1.

Referring now to FIG. 3, a circuit diagram of another example circuit 12' in accordance with an example of the disclosed concept which may be employed in the current sensing arrangement 10 of FIG. 1 is shown. Circuit 12' is the same as circuit 12 previously discussed in conjunction with FIG. 2, except circuit 12' includes a di/dt sensor input circuit 32' which does not include a capacitor such as capacitor C1 of FIG. 2. Accordingly, in di/dt sensor input circuit 32', first input 40 of second amplifier AMP2 is connected to first input 16 of circuit 12' via third resistor R3 and second input of second amplifier AMP2 is connected to second input 18 of circuit 12' via fourth resistor R4. In this arrangement the integration of the di/dt sensor signal can be performed digitally by a microcontroller. Digital integration eliminates concerns over drift and tolerance of the discrete resistors and capacitors used in the arrangement of FIG. 2.

Figure 4:
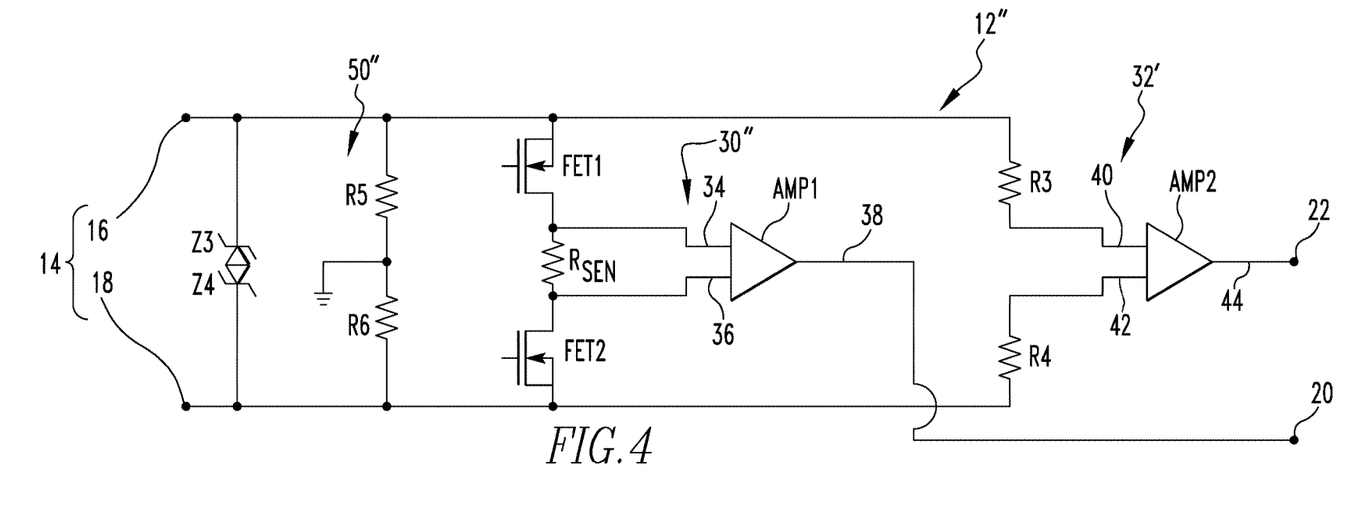
FIG. 4 is a circuit diagram of an example circuit in accordance with an example embodiment of the disclosed concept which may be employed in the current sensing arrangement of FIG. 1.

FIG. 4 is a circuit diagram of yet another example circuit 12" in accordance with an example embodiment of the disclosed concept which may be employed in the current sensing arrangement 10 of FIG. 1. Circuit 12" includes a di/dt sensor input circuit 32' the same as circuit 12' previously discussed in conjunction with FIG. 3. Unlike circuit 12', circuit 12" includes a current transformer input circuit 30" which includes a first field effect transistor FET1 connected between first input 16 and sense resistor Rsen (instead of first resistor R1 and first transient voltage suppression diode TVS1) and a second field effect transistor FET2 connected between sense resistor Rsen and second input 18 (instead of second resistor R2 and second transient voltage suppression diode TVS2). When a di/dt sensor is connected to inputs 16 and 18, first and second field effect transistors FET1 and FET2 would be off. By turning on first and second field effect transistors FET1 and FET2, the voltage that a current transformer connected to inputs 16 and 18 must drive is substantially reduced. This reduction in burden voltage improves the linearity of the current transformer, making this arrangement more suitable for metering applications.

Continuing to refer to FIG. 4, additionally, unlike circuit 12', circuit 12" includes a third circuit 50" which, similar to third circuit 50, includes a ground connected between first input 16 and second input 18, fifth resistor R5 connected between first input 16 and the ground, sixth resistor R6 connected between the ground and second input 18. Unlike third circuit 50 of circuits 12 and 12' of FIGS. 2 and 3, third circuit 50" does not include second or third capacitors C2 or C3. Also, unlike third circuit 50 of circuits 12 and 12' of FIGS. 2 and 3, third circuit 50" further includes a third zener diode Z3 and a fourth zener diode Z4 connected opposing in series between first input 16 and second input 18 in parallel with the arrangement of the ground and fifth and sixth resistors R5 and R6. In operation, third circuit 50" serves as a path to ground for input current to second amplifier AMP2 while third and fourth zener diodes Z3 and Z4 limit current transformer voltages in the case where a current transformer is operated without first field effect transistor FET1 and second field effect transistor FET2 turned on.

Figure 5:
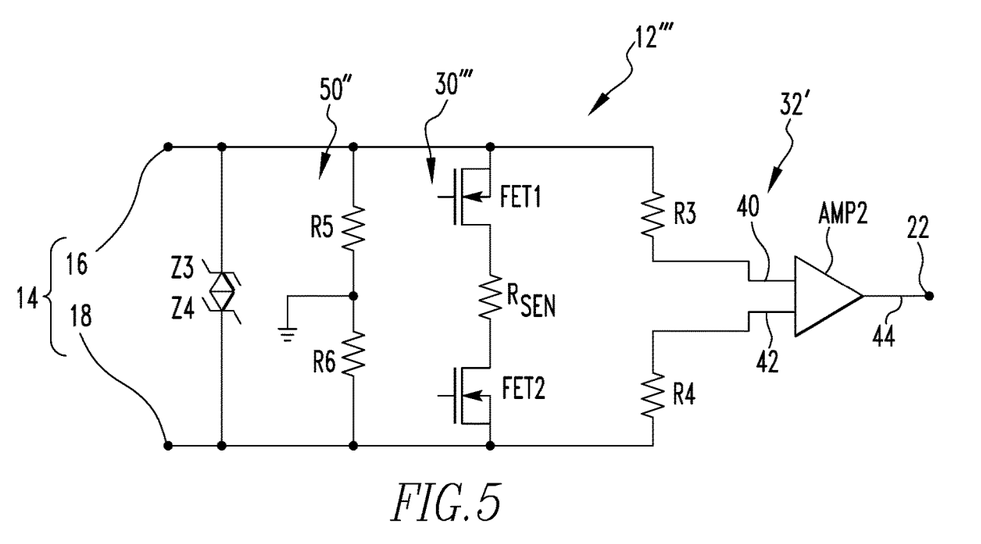
FIG. 5 is a circuit diagram of an example circuit in accordance with an example embodiment of the disclosed concept which may be employed in a current sensing arrangement similar to that of FIG. 1.

FIG. 5 is a circuit diagram of a further example circuit 12''' in accordance with an example embodiment of the disclosed concept which may be employed in a current sensing arrangement similar to that of FIG. 1. Similar to circuits 12' and 12", circuit 12''' includes a di/dt sensor input circuit 32' having output 44 from second amplifier AMP2 connected to an output 22 of circuit 12'''. However, unlike circuits 12, 12' and 12", previously discussed in conjunction with FIGS. 2-4, which included two outputs (i.e., first and second outputs 20 and 22), circuit 12''' only utilizes a single output, i.e., output 22. Similar to circuit 12" of FIG. 4, circuit 12''' utilizes a current transformer input circuit 30''' which includes first field effect transistor FET1 connected between first input 16 and sense resistor Rsen, and second field effect transistor FET2 connected between sense resistor Rsen and second input 18. However, unlike the arrangement shown in FIG. 4, current transformer input circuit 30''' does not include first amplifier AMP1. In this arrangement first and second field effect transistors FET1 and FET2 should be chosen such that their Rds on value is small compared to Rsense so that Rds on variations with temperature or Gate-Source voltage do not impact performance. Circuit 12''' also includes third circuit 50" such as described in conjunction with FIG. 4 and arranged in the same manner. The arrangement of FIG. 5 requires only a single interface to the microcontroller which is important in space constrained or pin-limited applications.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit comprising:
    an input pair having a first input and a second input, the input pair configured to have either of a current transformer or a di/dt sensor connected thereto;
    a first output;
    a second output;
    a current transformer input sub-circuit connected between the first input and the second input; and
    a di/dt sensor input sub-circuit connected between the first input and the second input,
    wherein the current transformer input sub-circuit is configured to receive output from a current transformer connected to the input pair and to output a signal representative of the magnitude of a current sensed by the current transformer via the first output,
    wherein the di/dt sensor input sub-circuit is configured to receive output from a di/dt sensor connected to the input pair and to output a signal representative of a current sensed or time rate of change of the current sensed by the di/dt sensor via the second output, and
    wherein the current transformer input sub-circuit and the di/dt sensor input sub-circuit are connected in a parallel arrangement with respect to each other and the input pair.

2. The circuit of claim 1, further comprising:
    a third sub-circuit connected between the first input and the second input, the third sub-circuit comprising:
        a ground connected between the first input and the second input,
        a fifth resistor connected in parallel with a second capacitor connected between the first input and the ground, and
        a sixth resistor connected in parallel with a third capacitor connected between the ground and the second input.

3. The circuit of claim 2, wherein the current transformer input sub-circuit, the di/dt sensor input sub-circuit, and the third sub-circuit are connected in a parallel arrangement between the first input and the second input.

4. The circuit of claim 1, further comprising:
    a third sub-circuit connected between the first input and the second input, the third sub-circuit comprising:
        a first arrangement comprising:
            a ground connected between the first input and the second input;
            a fifth resistor connected between the first input and the ground; and
            a sixth resistor connected between the ground and the second input; and
        a second arrangement comprising a third zener diode and a fourth zener diode connected opposing in series between the first input and the second input.

5. The circuit of claim 1, wherein the current transformer input sub-circuit comprises:
   a sense resistor connected between the first input and the second input;
   a first resistor connected in parallel with one of either a first transient voltage suppression diode or a first Zener diode connected between the first input and the sense resistor;
   a second resistor connected in parallel with another one of a second transient voltage suppression diode or a second Zener diode connected between the sense resistor and the second input; and
   a first amplifier having a first input connected on a first side of the sense resistor, a second input connected on an opposite second side of the sense resistor, and an output connected to the first output.

6. The circuit of claim 1, wherein the current transformer input sub-circuit comprises:
   a sense resistor connected between the first input and the second input;
   a first field effect transistor connected between the first input and the sense resistor;
   a second field effect transistor connected between the sense resistor and the second input; and
   a first amplifier having a first input connected on a first side of the sense resistor, a second input connected on an opposite second side of the sense resistor, and an output connected to the first output.

7. The circuit of claim 1, wherein the di/dt sensor input sub-circuit comprises:
   a first capacitor connected between the first input and the second input;
   a third resistor connected between the first input and the first capacitor;
   a fourth resistor connected between the first capacitor and the second input; and
   a second amplifier having a first input connected on a first side of the first capacitor and a second input connected on an opposite second side of the first capacitor, and an output connected to the second output.

8. The circuit of claim 5, wherein the di/dt sensor input sub-circuit comprises:
   a first capacitor connected between the first input and the second input;
   a third resistor connected between the first input and the first capacitor;
   a fourth resistor connected between the first capacitor and the second input; and
   a second amplifier having a first input connected on a first side of the first capacitor and a second input connected on an opposite second side of the first capacitor, and an output connected to the second output.

9. The circuit of claim 1, wherein the di/dt sensor input sub-circuit comprises:
   a second amplifier having a first input, a second input, and an output connected to the second output;
   a third resistor connected between the first input of the circuit and the first input of the second amplifier; and
   a fourth resistor connected between the second input of the circuit and the second input of the second amplifier.

10. The circuit of claim 5, wherein the di/dt sensor input sub-circuit comprises:
    a second amplifier having a first input, a second input, and an output connected to the second output;
    a third resistor connected between the first input of the circuit and the first input of the second amplifier; and
    a fourth resistor connected between the second input of the circuit and the second input of the second amplifier.

11. The circuit of claim 6, wherein the di/dt sensor input sub-circuit comprises:
    a second amplifier having a first input, a second input, and an output connected to the second output;
    a third resistor connected between the first input of the circuit and the first input of the second amplifier; and
    a fourth resistor connected between the second input of the circuit and the second input of the second amplifier.

12. A circuit breaker comprising:
    the circuit as recited in claim 1; and
    a microcontroller connected to the first output and the second output of the circuit.

13. The circuit breaker of claim 12, wherein the microcontroller is adapted to automatically sense which output from the first output or the second output corresponds to a current sensed by a current sensor connected to the input pair.

14. A current sensing arrangement comprising:
    the circuit as recited in claim 1;
    a current sensor structured to provide an output dependent on a sensed current, the current sensor connected to the input pair of the circuit; and
    a microcontroller connected to the first output and the second output of the circuit,
    wherein the current sensor is one of either a di/dt sensor or a current transformer, and
    wherein the circuit is configured to receive the output of the one current sensor that is connected to the input pair and provide an output signal which corresponds to the one current sensor via either the first output or the second output, dependent on which one of the di/dt sensor or the current transformer is connected to the input pair.

15. A circuit comprising:
    an input pair having a first input and a second input;
    an output;
    a first sensor input sub-circuit connected between the first input and the second input, the first sensor input sub-circuit comprising:
       a sense resistor connected between the first input and the second input;
       a first field effect transistor connected between the first input and the sense resistor; and
       a second field effect transistor connected between the sense resistor and the second input; and
    a second sensor input sub-circuit connected between the first input and the second input, the second sensor input sub-circuit comprising:
       an amplifier having a first input, a second input, and an output connected to the output of the circuit;
       a third resistor connected between the first input of the circuit and the first input of the amplifier; and
       a fourth resistor connected between the second input of the circuit and the second input of the amplifier,
    wherein the circuit is configured to receive output from one of either a current transformer or a di/dt sensor and output a signal representative of a current sensed by the one of either the current transformer or the di/dt sensor via the output.

16. The circuit of claim 15, further comprising:
    a third sub-circuit connected between the first input and the second input, the third sub-circuit comprising:
       a first arrangement comprising:
          a ground connected between the first input and the second input;

a fifth resistor connected between the first input and the ground; and
a sixth resistor connected between the ground and the second input; and
a second arrangement comprising a third zener diode and a fourth zener diode connected opposing in series between the first input and the second input.

17. A circuit breaker comprising:
the circuit as recited in claim 15; and
a microcontroller connected to the output of the circuit.

18. A current sensing arrangement comprising:
the circuit as recited in claim 15;
a current sensor structured to provide an output dependent on a sensed current, the current sensor connected to the input pair of the circuit; and
a microcontroller connected to the output of the circuit,
wherein the current sensor is one of either a di/dt sensor or a current transformer, and
wherein the circuit is configured to receive the output of the one of either the di/dt sensor or the current transformer which is connected to the input pair and provide an output signal which corresponds to the one of either the di/dt sensor or the current transformer via the output.

* * * * *